United States Patent
Werker et al.

(10) Patent No.: US 10,826,412 B2
(45) Date of Patent: Nov. 3, 2020

(54) METHOD FOR CONTROLLING POWER SEMICONDUCTORS IN AN INVERTER

(71) Applicant: Hanon Systems, Daejeon (KR)

(72) Inventors: Stephan Werker, Merzenich-Golzheim (DE); Gregor Sanzen, Insul (DE); Mario Lenz, Kerpen (DE)

(73) Assignee: Hanon Systems, Daejeon (KR)

( * ) Notice: Subject to any disclaimer, the term of this patent is extended or adjusted under 35 U.S.C. 154(b) by 0 days.

(21) Appl. No.: 15/975,218

(22) Filed: May 9, 2018

(65) Prior Publication Data

US 2019/0006955 A1 Jan. 3, 2019

(30) Foreign Application Priority Data

Jun. 29, 2017 (DE) .................. 10 2017 114 526

(51) Int. Cl.
| | | |
|---|---|---|
| *H02M 7/5395* | (2006.01) | |
| *H02M 1/44* | (2007.01) | |
| *H03K 17/082* | (2006.01) | |
| *H03K 17/16* | (2006.01) | |

(52) U.S. Cl.
CPC ........... *H02M 7/5395* (2013.01); *H02M 1/44* (2013.01); *H03K 17/0828* (2013.01); *H03K 17/168* (2013.01)

(58) Field of Classification Search
CPC .......... H02M 7/02; H02M 7/04; H02M 7/512; H02M 7/53; H02M 7/537; H02M 7/539; H02M 7/5395; H03K 17/08; H03K 17/082; H03K 17/0822; H03K 17/0828; H03K 17/16; H03K 17/168
See application file for complete search history.

(56) References Cited

U.S. PATENT DOCUMENTS

| | | | | |
|---|---|---|---|---|
| 2003/0112044 A1* | 6/2003 | Yin | ........................ | H03K 5/086 327/172 |
| 2007/0047272 A1 | 3/2007 | Kris | | |

FOREIGN PATENT DOCUMENTS

| | | |
|---|---|---|
| CN | 106330011 A | 1/2017 |
| DE | 102015110064 | 12/1916 |
| DE | 10310670 A1 | 9/2004 |
| JP | 2001128463 A | 5/2001 |
| JP | 2001296935 A | 10/2001 |
| JP | 2001346393 A | 12/2001 |
| JP | 2003175157 A | 6/2003 |
| JP | 2006211847 A | 8/2006 |
| JP | 2010104170 A | 5/2010 |
| JP | 2011109510 A | 6/2011 |
| JP | 2015106978 A | 6/2015 |
| JP | 2015154683 A | 8/2015 |
| JP | 2016046830 A | 4/2016 |
| JP | 2017033657 A | 2/2017 |
| KR | 20040017684 A | 2/2004 |
| KR | 1020140102413 | 8/2014 |
| WO | 2011131201 A1 | 10/2011 |

* cited by examiner

*Primary Examiner* — Diana J. Cheng
(74) *Attorney, Agent, or Firm* — Norton Rose Fulbright US LLP; James R. Crawford

(57) ABSTRACT

A method for the activation of power semiconductors in an inverter using a microprocessor controlling a pulse width modulation (PWM). The method serves for improving the electromagnetic compatibility (EMC) and is in particular applicable in electric refrigerant compressors of motor vehicles.

19 Claims, 6 Drawing Sheets

METHOD FOR CONTROLLING POWER SEMICONDUCTORS IN AN INVERTER

CROSS REFERENCE TO RELATED APPLICATIONS

Figure 1:
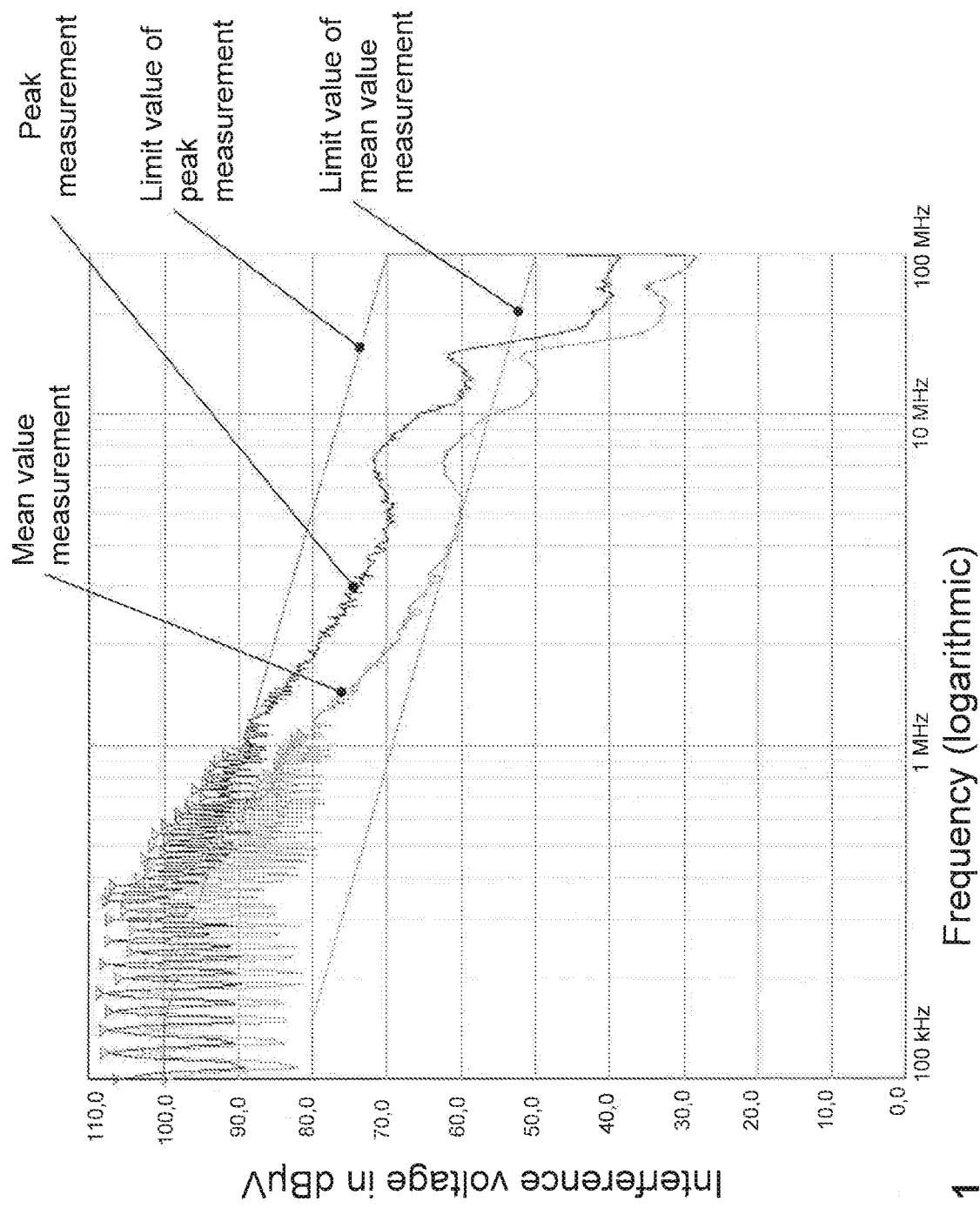

This application claims priority from German Patent Application No. 102017114526.5 filed Jun. 29, 2017, which is hereby incorporated by reference in its entirety.

The invention relates to a method for activating power semiconductors in an inverter. The invention serves for improving electromagnetic compatibility (EMC) and is in particular applicable in electric refrigerant compressors of motor vehicles.

In electric refrigerant compressors of a motor vehicle a multi-phase, most frequently a three-phase, rotary field is generated with the aid of an inverter. This is carried out thereby that from the battery direct current (DC) via the periodic switching of semiconductors in the inverter a sine or sinusoidal current is impressed onto the motor inductance. It is prior art to activate the power semiconductors with constant clock frequency. Depending on the power class, a frequency between 5 to 30 kHz is selected for this purpose. The regulation of the current strength and the motor speed results from the control of the power-on times of the individual power semiconductors by means of a pulse width modulation. Pulse Width Modulation (PWM) denotes in general a type of modulation in which a technical variable, for example an electric voltage, alternates between two values, and the pulse duty factor, i.e. the duration of power-on time in a timing cycle (period duration) can alternate between these values.

The switching of the semiconductors generates interferences with the inverse value of the period duration. The [corresponding] frequency can be denoted as fundamental wave. The switching of the power conductors also generates interferences on the harmonics, the multiples of the fundamental wave frequency, and thus has considerable effects on the electromagnetic compatibility.

The capability of a technical device not to subject other devices to unintentional or accidental electric or electromagnetic effects or be subjected to same by other devices is referred to as electromagnetic compatibility (EMC).

The problem underlying the invention comprises reducing the EMC interferences occurring in an inverter that is activating power semiconductors.

The problem is resolved through a method with the characteristics according to Claim 1. Further developments are specified in the dependent patent claims.

The method according to the invention for activating power semiconductors in an inverter is carried out by means of a microprocessor controlling a pulse width modulation (PWM), wherein the method comprises the following steps:
  i creating, computing and/or selecting a numerical value as a first factor out of a defined range of numbers, preferably from 0.1 to 1, especially preferred between 0.3 and 1;
  ii computation of a clock frequency A of the pulse width modulation through the multiplication of the first factor by the value of a fundamental switching frequency;
  iii after the passage of a number X of PWM clock cycles or after the passage of a certain time period T with the previously computed clock frequency A, computation of a new clock frequency A through the multiplication of a newly created, computed and/or selected numerical value out of the defined number range as a new factor by the fundamental switching frequency;
  iv multiple iterations of step iii, wherein after the passage of a number X of clock cycles or after the passage of a certain time period T with the particular previously computed clock frequency, computation of a new clock frequency is carried out through the multiplication of the fundamental switching frequency by a, in each instance, newly created/computed and/or selected numerical value.

To implement a random pulse width modulation (PWM), the clock frequency is changed through the above described process in the microprocessor that activates the power semiconductors across driver circuits.

According to a first embodiment of the invention, the process is executed in the following steps i-iv:
  i setting up a lookup table with a number Y of random numbers out of the defined number range, preferably by means of a random number generator, whose probability density within the defined numerical range corresponds to a Gaussian distribution or a uniform distribution, and selection of the first random number of the table as the first factor;
  ii computation of the clock frequency A of the pulse width modulation through the multiplication of the value of the fundamental switching frequency by the first factor;
  iii after the passage of a number X of clock cycles or after the passage of a certain time period T with the previously computed clock frequency A, computation of a new clock frequency A through the multiplication of the next random number from the table by the value of the fundamental switching frequency;
  iv multiple iterations of step iii thereby that, after the passage of a number X of clock cycles or after the passage of a certain time period T with the previously computed clock frequency, the computation of a new clock frequency is carried out through the multiplication of the value of the fundamental switching frequency by the value of the, in each instance, next following random number in the table until the end of the table is reached.

According to an advantageous further development of this embodiment, steps ii to iv are repeated until the end of the table has been reached. That means that after the [routine] has run through the table from beginning to end, it jumps back again to the beginning of the table after the last random number has been used.

According to a second embodiment of the invention, the method executes the following steps i-iv:
  i computation of a number sequence R delimited within the defined numerical range using a mathematical formula and computation of a first element of the number sequence R or generation of a random number with the aid of a random number generator implemented in the microprocessor, each during the run time of the microprocessor;
  ii computation of the clock frequency A of the pulse width modulation through the multiplication of the value of the fundamental switching frequency by the first computed element from the number sequence R or by the first generated random number;
  iii after the passage of a number X of clock cycles or after the passage of a certain time period T with the previously computed clock frequency A, computation of a new clock frequency A through the multiplication of the value of the fundamental switching frequency by the value of a next computed element from the number sequence R or by a next generated random number;

iv multiple iterations of step iii, wherein, after the passage of a number X of clock cycles or after the passage of a certain time period T with the, in each instance, previously computed clock frequency, the computation of a new clock frequency is carried out through the multiplication of the value of the fundamental switching frequency by the value of the, in each instance, new element of the number sequence R or by a new random number.

The mathematical formula preferably contains one or several nonlinear functions, such as for example SIN, COS and/or TAN and/or their inverse functions ARCSIN, ARCCOS and/or ARCTAN and/or log and/or e [exponential].

The computation of the number sequence R and/or its elements or the random number is preferably carried out in a separate unit or in the microprocessor controlling the pulse width modulation. Especially preferred is the computation of the number sequence and/or of its elements or of the random numbers by means of an external input variable. As an input variable for the computation of the number sequence and/or of its numerical values or of the random numbers a random process, preferably noise such as, for example, [thermal] resistance noise or shot noise or a temperature curve can be utilized. However, the computation can also be carried out without an external input variable.

By random number generator is generally understood a process that generates a sequence of random numbers. In principle, there is a distinction made between non-deterministic and deterministic random number generators. Among the non-deterministic random number generators, i.e. random number generators that yield different values at identical initial conditions, are in particular physical random number generators which, for the generation of the random numbers, utilize physical processes, such as for example thermal resistance noise. Deterministic random number generators generate pseudorandom numbers and, as a rule, are therefore called pseudorandom number generators. The number sequences consisting of pseudorandom numbers can be generated significantly more simply by computers and are available in virtually all higher programming languages. Suitable as sources are for example the software of MS-Excel™, MATLAB™ and Linux™ Kernel.

According to a third embodiment of the invention the method executes the following steps i-iv:
  i generation of a random input variable for the computation of a clock frequency in an electronic circuitry using a random oscillator such that at any given point in time a random number in the defined number range is available;
  ii computation of a clock frequency A through the multiplication of the value of the fundamental switching frequency by the value of the random number at a first point in time;
  iii after the passage of a number X of clock cycles or after the passage of a certain time period T with the previously computed clock frequency A, computation of a new clock frequency A through the multiplication of the value of the fundamental switching frequency by the value of the random number that is available at this point in time;
  iv multiple iterations of step iii, wherein, after the passage of a number X of clock cycles or after the passage of a certain time period T with the, in each instance, previously computed clock frequency, computation of a new clock frequency is carried out through the multiplication of the value of the fundamental switching frequency by the value of the new random number that is available at this particular point in time.

The random input variable can again be generated by processing a random physical process, for example [thermal] resistance noise or shot noise.

According to an especially advantageous implementation of the method according to the invention, certain clock frequencies that are known to be, or are identified as, interference frequencies are omitted or immediately terminated, wherein a new computation of the clock frequency takes place. By omission is understood in this context that individual specific clock frequencies can not be computed/called up or generated. This is, for example, advantageous when the frequency to be blanked out, or a harmonic thereof, would lead to strong interferences in the system, for example of a motor vehicle.

As an example, a component in the motor vehicle may be assumed to respond with an error function to interferences with the frequency 50 kHz. The third harmonic of a PWM clock frequency of 16.6 kHz would correspond to just this frequency of 50 kHz. To avoid the error function, the value that would lead to a clock frequency of 16.6 kHz can now be removed from the lookup table.

The advantage of the invention resides therein that through the above described random or quasi-random selection of the clock frequency of the inverter the interference spectrum is smoothed out. While the power density of the interference spectrum remains the same, the number and pronounced manifestation of the interference harmonics decrease significantly. Through this measure the requirements made of the EMC filter of the inverter that has to be physically constructed can be lowered. The fabrication expenditures, the costs and the space requirement can hereby be decreased.

According to an implementation of the method it comprises further an additional step v, in which, depending on the application mode or operating mode, a selection of a probability density for the clock frequencies to be selected is made, wherein switching-over between probability densities can also take place. In said first embodiment two lookup tables, for example with different probability densities, can be stored for this purpose. In said second embodiment the formula for the computation of the number sequence R and of its elements, which by means of quasi-random numbers, changes. In the above described third embodiment switching-over in the circuitry of a random number oscillator is conceivable. The probability density is selected from a uniform distribution or a Gaussian distribution of the clock frequencies, wherein it is feasible to switch over between uniform and Gaussian distribution.

Figure 2:
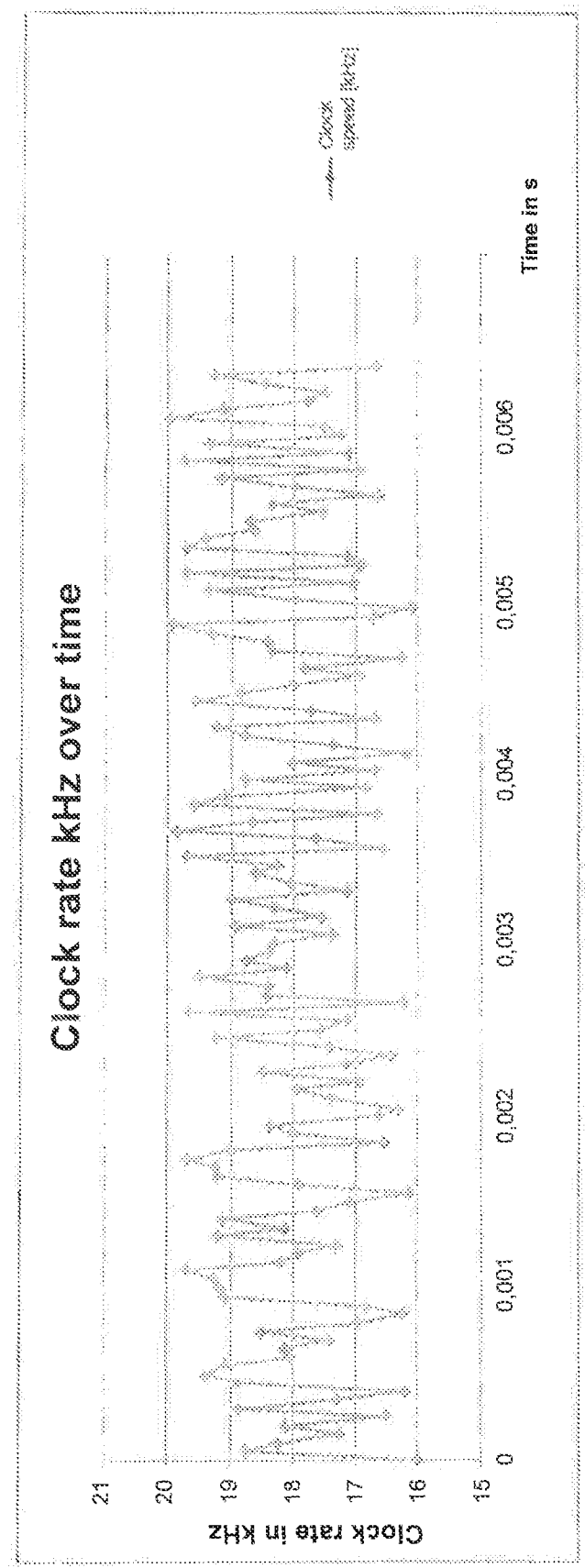
Figure 3:
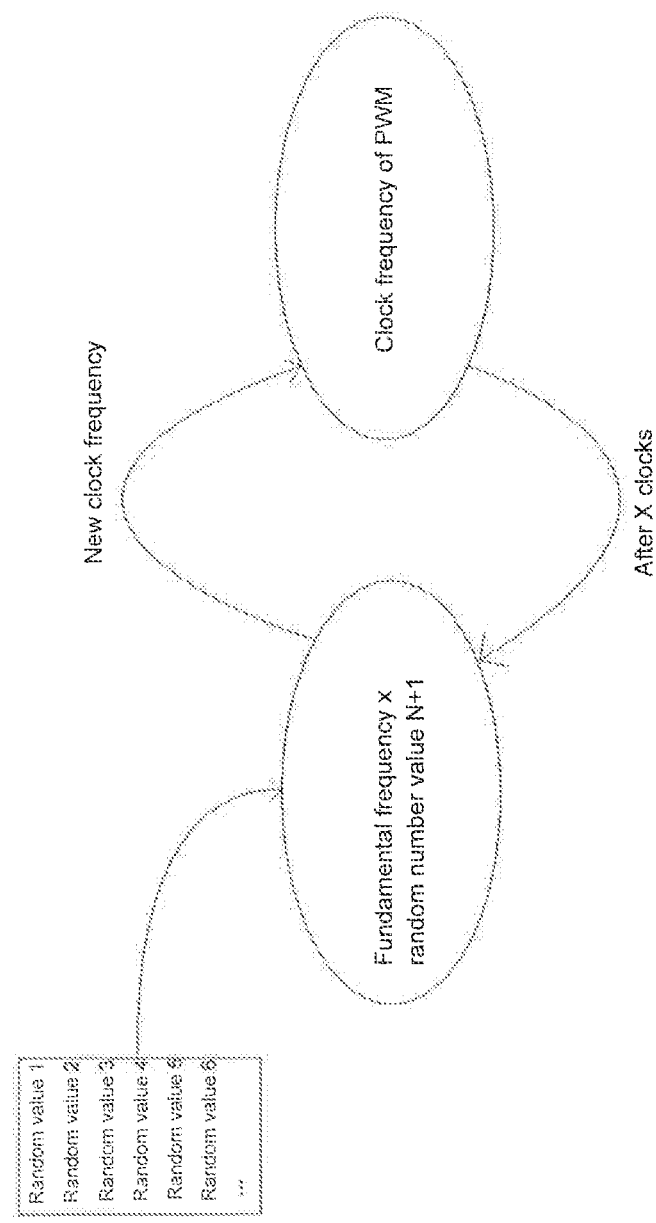

Further details, characteristics and advantages of implementations of the invention are evident based on the following description of embodiment examples with reference to the associated drawing. Therein depict:

FIG. 1: EMC measurement protocol of an inverter, Prior Art;

FIG. 2: Distribution of clock frequency over time (uniform distribution);

FIG. 3: Schematic depiction of a first embodiment variant of the method for activating power semiconductors, FIG. 4: Schematic depiction of a second embodiment variant of the method for activating power semiconductors, and FIG. 5: Schematic depiction of a third embodiment variant of the method for activating power semiconductors, and FIG. 6: an EMC interference spectrum with random pulse width modulation (PWM).

FIG. 1 shows an EMC measurement protocol of an inverter switching with 20 kHz clock frequency, more precisely a typical recording of the EMC measurement of an electric air-conditioning compressor with a fixedly set clock frequency. Herein the interfering harmonics of the clock frequency in the range of 100 kHz to 1 MHz can clearly be seen. All harmonics are multiples of the clock frequency. The EMC interferences are given in the unit decibel microvolt (dBµV).

The clock frequency according to prior art is constant, for example at a clock frequency value of 20 kHz. In random mode, i.e. when applying the random pulse width modulation (PWM) that is applied according to the invention, the clock frequency changes at short time periods, for example every 50 µs, within a specific variation range of the percentage deviation of the fundamental frequency. In the embodiment example shown in FIG. 2 the clock frequency changes within a range of a lower clock frequency limit of 16 kHz up to an upper clock frequency limit of 20 kHz, wherein the mean clock frequency is 18 kHz and the maximal deviation is 20%. As clearly shown in FIG. 2, a clock frequency results that is distributed over time, wherein a uniform distribution is indicated.

To implement the random PWM, in the microprocessor that activates the power semiconductors the clock frequency of the PWM is randomly or quasi-randomly changed. There are several different embodiment variants for this purpose.

According to a first embodiment variant which is shown schematically in FIG. 3, in a first step i, first, a lookup table with a number Y of random numbers (random values 1 to 6) is compiled, preferably by means of a random number generator and especially preferred in a number range from 0.5 to 1. The probability density of the random numbers within the defined number range corresponds to a Gaussian distribution or a uniform distribution. The selection of the first random number of the table as the first factor is carried out and in a second step ii the computation of the clock frequency A of the pulse width modulation PWM through the multiplication of the value of the fundamental switching frequency, for example of 20 kHz, by the first factor takes place. After the passage of a number X of clock cycles or after the passage of a certain time period T with the previously computed clock frequency A, follows in a third step iii the computation of a new clock frequency A through the multiplication of the next random number from the table by the value of the fundamental switching frequency. A further step comprises the multiple iterations of the third step until the end of the table has been reached. That means, after the passage of a number X of clock cycles or after the passage of a certain time period T with a previously computed clock frequency, in each instance the computation of a new clock frequency is carried out through the multiplication of the value of the fundamental switching frequency by the value of the next random number (random number N+1) in the table. After reaching the end of the table, the above described steps ii to iv are subsequently repeated. That means that after the table has been run through from the beginning to the end and after the last random number of the table has been used, the process returns again to the beginning of the table and the next clock frequency is again computed with the first random number.

It can furthermore be provided that, with respect to the probability density of the frequencies, depending on application mode and operating mode, a selection can be made. For example, switching over between uniform and Gaussian distribution of the factors for computing the clock frequencies can take place.

Figure 4:
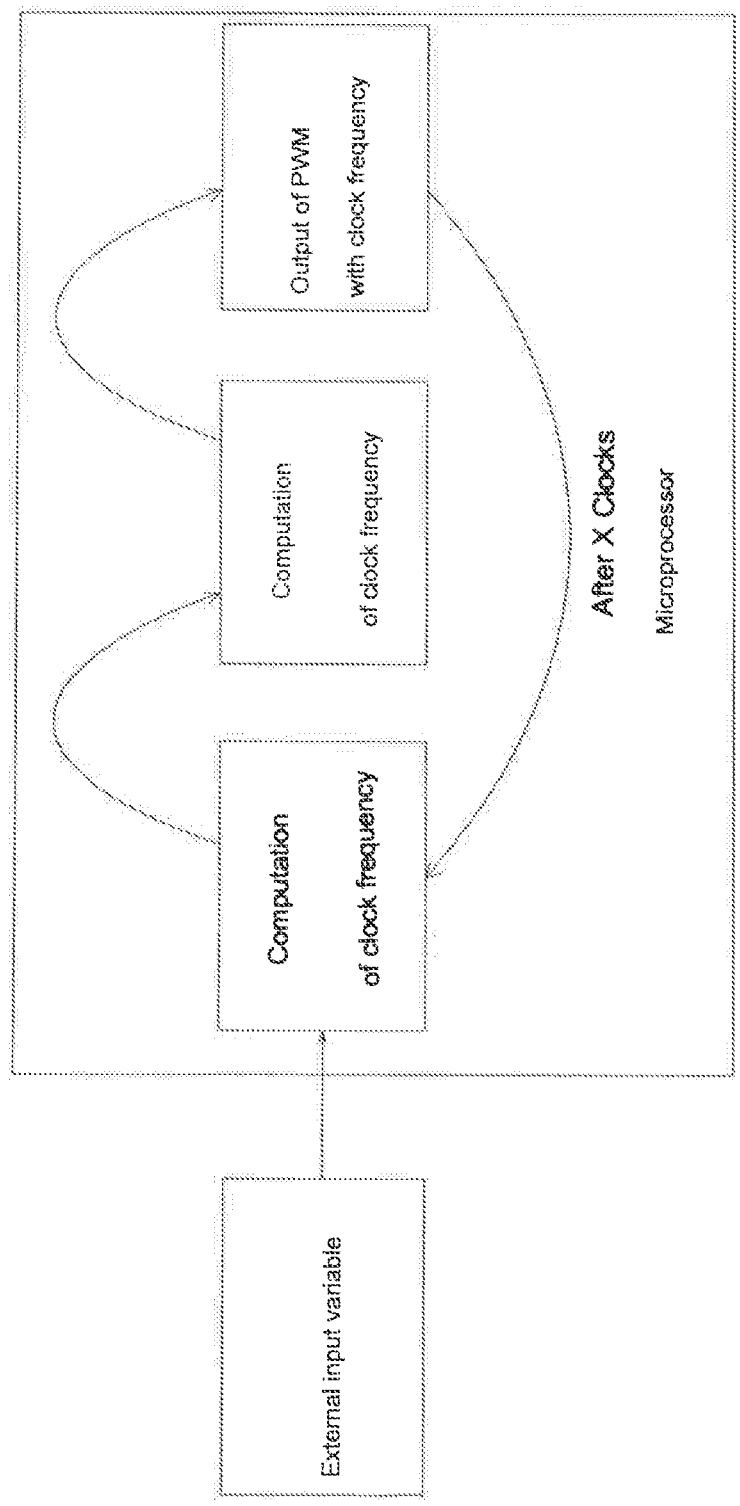

According to a second embodiment variant, which is shown schematically in FIG. 4, a random number is computed in a first step during the run time of the microprocessor. Herein, first, a number sequence R within the limits of the defined number range can be computed using a mathematical formula, as the element of which number sequence the random number is determined. The random number can also be computed during the run time of the microprocessor with the aid of a random number generator implemented in the microprocessor. The computation of the number sequence and/or of its elements or of the random numbers is carried out according to the depicted embodiment example by means of an external input variable.

In the second step the clock frequency A is subsequently computed through the multiplication of the value of the fundamental switching frequency by the first computed element from the number sequence R or by the first random number generated by means of the random number generator and the pulse width modulation is output with this clock frequency.

After the passage of a number X of clock cycles or after the passage of a certain time period T with the previously computed clock frequency A, a new clock frequency A is computed through the multiplication of the value of the fundamental switching frequency by the value of an element computed next from the number sequence R or by a random number generated next by means of the random number generator and the pulse width modulation PWM is output with this clock frequency. The process is subsequently repeated any number of times. This means, after the passage of a number X of clock cycles or after the passage of a certain time period T with the, in each instance, previously computed clock frequency, the computation of a new clock frequency with which the pulse width modulation PWM is output, is carried out through multiplication of the value of the fundamental switching frequency by the value of a, in each instance, new element of the number sequence R or by a new random number.

Figure 5:
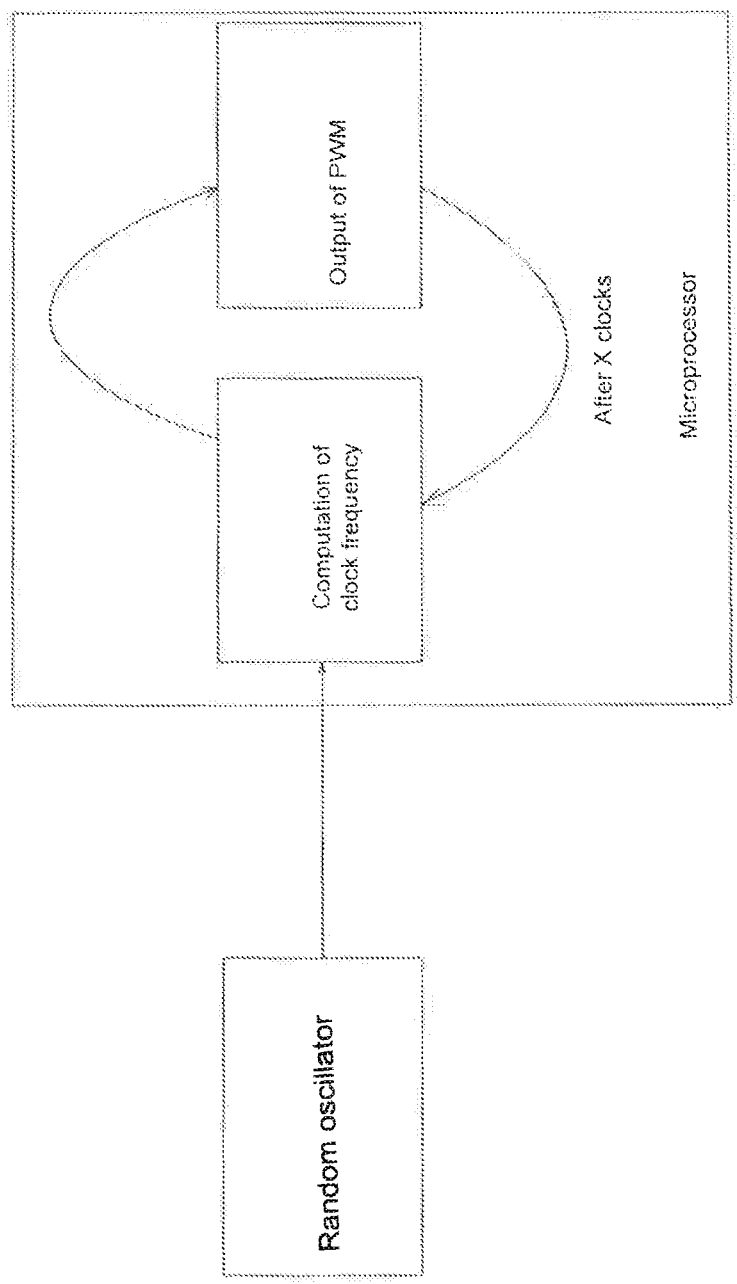
Figure 6:
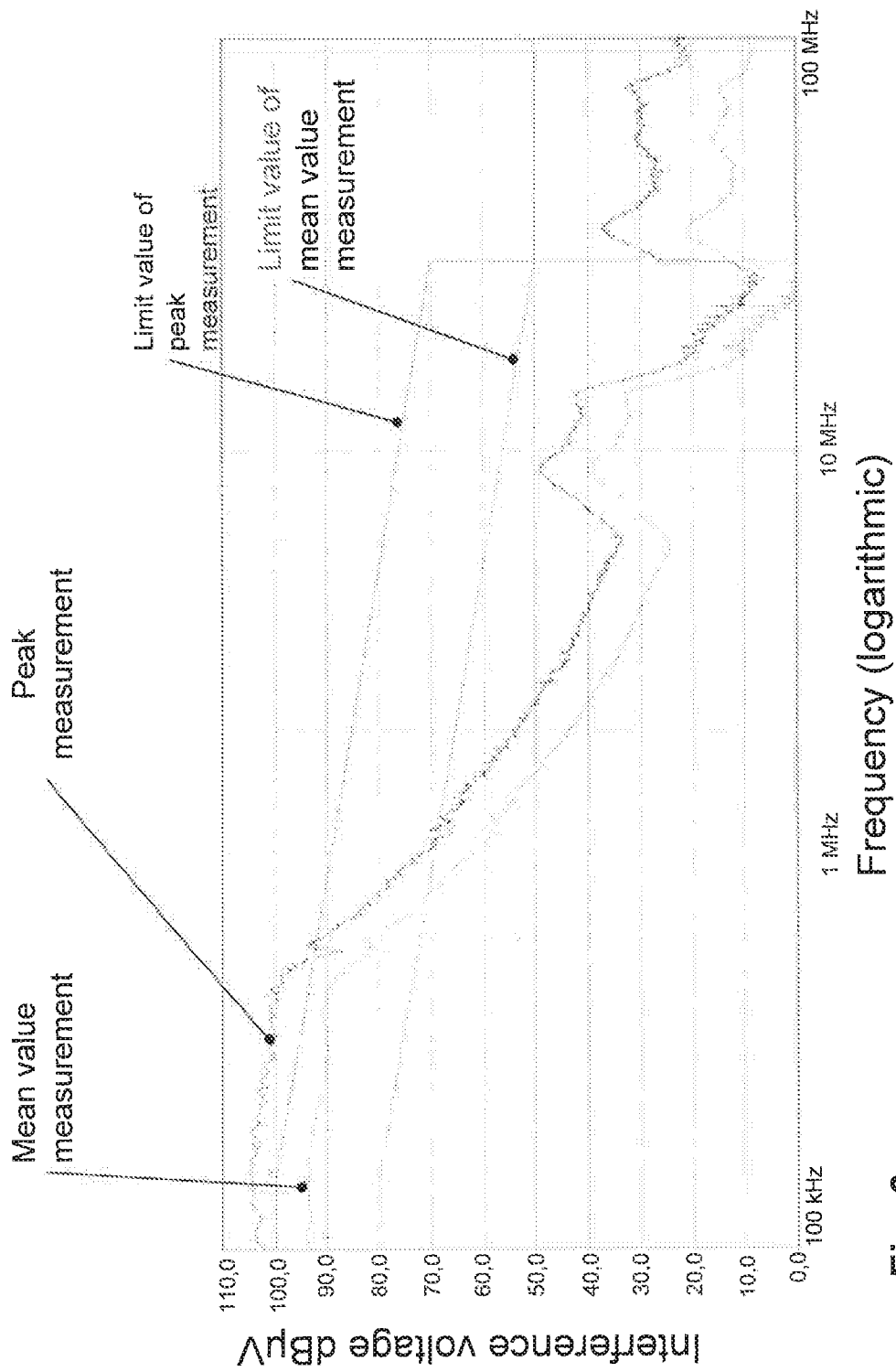

According to a third embodiment variant which is shown schematically in FIG. 5 a random input variable for the computation of a clock frequency is generated in an electronic circuitry with the aid of a random number generator such that at any given point in time a random number in the defined number range is available. Thus, at a first point in time the computation of a clock frequency A of the pulse width modulation PWM is carried out through the multiplication of the value of the fundamental switching frequency by the value of the random number. The pulse width modulation is output with this clock frequency.

After the passage of a number X of clock cycles or after the passage of a certain time period T with the previously computed clock frequency A, a new clock frequency A is computed through the multiplication of the value of the fundamental switching frequency by the value of the random number that is available at this point in time, wherein the pulse width modulation is output with this clock frequency.

This process is subsequently iterated any number of times. That means, after the passage of a number X of clock cycles or after the passage of a certain time period T with the previously computed clock frequency, through the multiplication of the value of the fundamental switching frequency by the value of the new random number that is available at this point in time, a new clock frequency is computed with which the output of the pulse width modulation takes place.

The advantage of the invention resides therein that through the random selection of the clock frequency the interference spectrum is smoothed out. While the power density of the interference spectrum, determinable through the surface area below the curve, remains the same, the number and pronounced manifestation of the interference waves, however, decrease significantly, as FIG. 6 in comparison to FIG. 1 shows. This occurs as a consequence of the randomization of the PWM which leads to the distribution of the harmonics.

The invention claimed is:

1. A method for activating power semiconductors in an inverter by means of a microprocessor controlling a pulse width modulation (PWM), wherein the method comprises the following steps:
   i creating, computing and/or selecting a numerical value as a first factor out of a defined number range;
   ii computing a clock frequency A of the pulse width modulation (PWM) through the multiplication of the first factor by the value of a fundamental switching frequency;
   iii after the passage of a number X of clock cycles or after the passage of a certain time period T with the previously computed clock frequency A, computation of a new clock frequency A through the multiplication of a newly created, computed and/or selected numerical value out of the defined number range as a new factor by the fundamental switching frequency;
   iv multiple iterations of step iii thereby that after the passage of a number X of clock cycles or after the passage of a certain time period T with the, in each instance, previously computed clock frequency, the computation of a new clock frequency is carried out through the multiplication of the fundamental switching frequency by a, in each instance, newly created/computed and/or selected numerical value, wherein the steps i-iv are executed as follows:
      i setting up a table with a number Y of random numbers from the defined number range whose probability density within the defined number range corresponds to a Gaussian distribution or a uniform distribution, and selecting the first random number of the table as the first factor;
      ii computation of the clock frequency A of the pulse width modulation (PWM) through the multiplication of the value of the fundamental switching frequency by the first factor;
      iii after the passage of a number X of clock cycles or after the passage of a certain time period T with the previously computed clock frequency A, computation of a new clock frequency A through the multiplication of the next random number from the table by the value of the fundamental switching frequency;
      iv multiple iterations of step iii, wherein, after the passage of a number X of clock cycles or after the passage of a certain time period T with the previously computed clock frequency, the computation of a new clock frequency is carried out through the multiplication of the value of the fundamental switching frequency by the value of the random number following, in each instance, next in the table until the end of the table has been reached.

2. A method according to claim 1, wherein after the end of the table has been reached, steps ii to iv are repeated.

3. A method according to claim 2, wherein specific clock frequencies that are known as, or are identified as, interference frequencies are omitted or immediately terminated, wherein a new computation of the clock frequency is carried out.

4. A method according to claim 1, wherein specific clock frequencies that are known as, or are identified as, interference frequencies are omitted or immediately terminated, wherein a new computation of the clock frequency is carried out.

5. A method according to claim 1, wherein specific clock frequencies that are known as, or are identified as, interference frequencies are omitted or immediately terminated, wherein a new computation of the clock frequency is carried out.

6. A method for activating power semiconductors in an inverter by means of a microprocessor controlling a pulse width modulation (PWM), wherein the method comprises the following steps:
   i creating, computing and/or selecting a numerical value as a first factor out of a defined number range;
   ii computing a clock frequency A of the pulse width modulation (PWM) through the multiplication of the first factor by the value of a fundamental switching frequency;
   iii after the passage of a number X of clock cycles or after the passage of a certain time period T with the previously computed clock frequency A, computation of a new clock frequency A through the multiplication of a newly created, computed and/or selected numerical value out of the defined number range as a new factor by the fundamental switching frequency;
   iv multiple iterations of step iii thereby that after the passage of a number X of clock cycles or after the passage of a certain time period T with the, in each instance, previously computed clock frequency, the computation of a new clock frequency is carried out through the multiplication of the fundamental switching frequency by a, in each instance, newly created/computed and/or selected numerical value, wherein steps i-iv are executed as follows:
      i computation of a number sequence R within the defined number range using a mathematical formula and computation of a first element of the number sequence R or generation of a random number with the aid of a random number generator implemented in the microprocessor, each during the run time of the microprocessor;
      ii computation of the clock frequency A of the pulse width modulation (PWM) through the multiplication of the value of the fundamental switching frequency by the first computed element from the number sequence R or by the generated random number;
      iii after the passage of a number X of clock cycles or after the passage of a certain time period T with the previously computed clock frequency A, computation of a new clock frequency A through the multiplication of the value of the fundamental switching frequency by the value of the next computed element from the number sequence R or by a random number generated next;
      iv multiple iterations of step iii, wherein, after the passage of a number X of clock cycles or after the passage of a certain time period T with the particular previously computed clock frequency, computation is carried out of a new clock frequency through the multiplication of the value of the fundamental switching frequency by the value of a, in each instance, new element of the number sequence R or by a new random number.

7. A method according to claim 6, wherein the mathematical formula contains one or several nonlinear functions.

8. A method according to claim 7, wherein the computation of the number sequence R and/or of its elements or of the random number is either carried out in a separate unit or in the microprocessor controlling the pulse width modulation (PWM).

9. A method according to claim 7, wherein the computation of the number sequence [R] and/or of its elements or of the random number is carried out by means of an external input variable.

10. A method according to claim 7, wherein specific clock frequencies that are known as, or are identified as, interference frequencies are omitted or immediately terminated, wherein a new computation of the clock frequency is carried out.

11. A method according to claim 6, wherein the computation of the number sequence R and/or of its elements or of the random number is either carried out in a separate unit or in the microprocessor controlling the pulse width modulation (PWM).

12. A method according to claim 11, wherein the computation of the number sequence [R] and/or of its elements or of the random number is carried out by means of an external input variable.

13. A method according to claim 11, wherein specific clock frequencies that are known as, or are identified as, interference frequencies are omitted or immediately terminated, wherein a new computation of the clock frequency is carried out.

14. A method according to claim 6, wherein the computation of the number sequence [R] and/or of its elements or of the random number is carried out by means of an external input variable.

15. A method according to claim 14, wherein specific clock frequencies that are known as, or are identified as, interference frequencies are omitted or immediately terminated, wherein a new computation of the clock frequency is carried out.

16. A method according to claim 6, wherein specific clock frequencies that are known as, or are identified as, interference frequencies are omitted or immediately terminated, wherein a new computation of the clock frequency is carried out.

17. A method for activating power semiconductors in an inverter by means of a microprocessor controlling a pulse width modulation (PWM), wherein the method comprises the following steps:
i creating, computing and/or selecting a numerical value as a first factor out of a defined number range;
ii computing a clock frequency A of the pulse width modulation (PWM) through the multiplication of the first factor by the value of a fundamental switching frequency;
iii after the passage of a number X of clock cycles or after the passage of a certain time period T with the previously computed clock frequency A, computation of a new clock frequency A through the multiplication of a newly created, computed and/or selected numerical value out of the defined number range as a new factor by the fundamental switching frequency;
iv multiple iterations of step iii thereby that after the passage of a number X of clock cycles or after the passage of a certain time period T with the, in each instance, previously computed clock frequency, the computation of a new clock frequency is carried out through the multiplication of the fundamental switching frequency by a, in each instance, newly created/computed and/or selected numerical value,
wherein the steps i-iv are executed as follows:
i generation of a random input variable for the computation of a clock frequency in an electronic circuitry with the aid of a random oscillator such that at any given point in time a random number in the defined number range is available;
ii computation of a clock frequency A through the multiplication of the value of the fundamental switching frequency by the value of the random number at a first point in time;
iii after the passage of a number X of clock cycles or after the passage of a certain time period T with the previously computed clock frequency A, computation of a new clock frequency A through the multiplication of the value of the fundamental switching frequency by the value of the random number available at this point in time;
iv multiple iterations of step iii, wherein after the passage of a number X of clock cycles or after the passage of a certain time period T with the particular previously computed clock frequency, computation is carried out of a new clock frequency through the multiplication of the value of the fundamental switching frequency by the value of the new random number that is available at this point in time.

18. A method for activating power semiconductors in an inverter by means of a microprocessor controlling a pulse width modulation (PWM), wherein the method comprises the following steps:
i creating, computing and/or selecting a numerical value as a first factor out of a defined number range;
ii computing a clock frequency A of the pulse width modulation (PWM) through the multiplication of the first factor by the value of a fundamental switching frequency;
iii after the passage of a number X of clock cycles or after the passage of a certain time period T with the previously computed clock frequency A, computation of a new clock frequency A through the multiplication of a newly created, computed and/or selected numerical value out of the defined number range as a new factor by the fundamental switching frequency;
iv multiple iterations of step iii thereby that after the passage of a number X of clock cycles or after the passage of a certain time period T with the, in each instance, previously computed clock frequency, the computation of a new clock frequency is carried out through the multiplication of the fundamental switching frequency by a, in each instance, newly created/computed and/or selected numerical value, further comprising a step v, in which, depending on the application mode or operating mode, a selection of a probability density for the clock frequencies to be selected is made, wherein also switching-over between the probability densities can take place.

19. A method according to claim 18, wherein the probability density is selected from a uniform distribution or a Gaussian distribution of the clock frequencies.

* * * * *